(12) United States Patent
Sorloaica et al.

(10) Patent No.: US 10,361,327 B2
(45) Date of Patent: Jul. 23, 2019

(54) PHOTOVOLTAIC MODULES INCORPORATING LATERAL HEAT REMOVAL

(71) Applicant: University of Central Florida Research Foundation, Inc., Orlando, FL (US)

(72) Inventors: Nicoleta Sorloaica, Orlando, FL (US); Robert Reedy, Auburndale, FL (US)

(73) Assignee: UNIVERSITY OF CENTRAL FLORIDA RESEARCH FOUNDATION, Orlando, FL (US)

( * ) Notice: Subject to any disclaimer, the term of this patent is extended or adjusted under 35 U.S.C. 154(b) by 292 days.

(21) Appl. No.: 14/206,433

(22) Filed: Mar. 12, 2014

(65) Prior Publication Data

US 2014/0261682 A1  Sep. 18, 2014

Related U.S. Application Data

(60) Provisional application No. 61/777,530, filed on Mar. 12, 2013.

(51) Int. Cl.
| | |
|---|---|
| *H01L 31/052* | (2014.01) |
| *H01L 31/049* | (2014.01) |
| *H02S 40/42* | (2014.01) |

(52) U.S. Cl.
CPC ........ *H01L 31/0521* (2013.01); *H01L 31/049* (2014.12); *H02S 40/425* (2014.12); *Y02E 10/50* (2013.01)

(58) Field of Classification Search
CPC . H01L 31/052–0521; H01L 31/022425; H01L 31/022433; H01L 31/049; H02S 40/40–425

USPC .................................................. 136/246, 259
See application file for complete search history.

(56) References Cited

U.S. PATENT DOCUMENTS

| | | | |
|---|---|---|---|
| 6,398,994 B1 | 6/2002 | Klett | |
| 7,456,131 B2 | 11/2008 | Klett et al. | |
| 7,728,219 B2 | 6/2010 | Corrales | |
| 7,985,919 B1* | 7/2011 | Roscheisen | H01L 31/0392 136/246 |
| 8,420,926 B1 | 4/2013 | Reedy et al. | |
| 2005/0161074 A1* | 7/2005 | Garvison | F24J 2/5228 136/246 |
| 2010/0275973 A1* | 11/2010 | Carnation | F24J 2/202 136/248 |

(Continued)

FOREIGN PATENT DOCUMENTS

EP    1630875 A2    3/2006

OTHER PUBLICATIONS

Lee, et al. "Thermally conductive and electrically insulating EVA composite encapsulants for solar photovoltaic (PV) cell", eXPRESS Polymer Letter, 2(5):357-363, 2008.

(Continued)

*Primary Examiner* — Allison Bourke
(74) *Attorney, Agent, or Firm* — Neil R. Jetter; Jetter & Associates, P.A.

(57) ABSTRACT

In one embodiment, a photovoltaic module includes a stack of layers, the module having an active layer and a planar heat sink positioned within the stack of layers adjacent the active layer, the heat sink being adapted to laterally remove heat from the active layer and the module.

14 Claims, 3 Drawing Sheets

(56) References Cited

U.S. PATENT DOCUMENTS

2012/0031464 A1\* 2/2012 Johnston ............... H01L 31/052
   136/246
2012/0080078 A1 4/2012 Farrelly et al.
2014/0209168 A1\* 7/2014 Zhamu ................. H01L 31/052
   136/259

OTHER PUBLICATIONS

Thermal Conductive Back Sheets, http://www.aitechnology.com/products/solar/uv-stable-protective-back-sheets/.
Callister et al., Materials Science and Engineering an Introduction, John Wiley 2010, 8th Edition.

\* cited by examiner

PHOTOVOLTAIC MODULES INCORPORATING LATERAL HEAT REMOVAL

CROSS-REFERENCE TO RELATED APPLICATION(S)

This application claims priority to U.S. Provisional Application Ser. No. 61/777,530, filed Mar. 12, 2013, which is hereby incorporated by reference herein in its entirety.

BACKGROUND

Photovoltaic modules are being used with increasing frequency to generate electricity. During daylight hours, the modules are exposed to sunlight that is converted to electricity, typically by an active semiconductor layer, or "active layer," made of crystalline silicon.

In addition to generating electricity, the active layer generates a great amount of heat. This heat adversely affects the module. First, the heat reduces electric energy output of the module. In the typical case, energy output is reduced by approximately one half of a percent per degree Celsius in the temperature of the active layer. Second, the heat causes degradation of the module. In addition to ultimately causing failure of the module, the degradation further reduces the output of the module by approximately one percent per year during its life. These combined heat-related effects result in a significant reduction of energy output over the life of the module as well as a shortening of that life.

In view of the deleterious effects of heat on photovoltaic modules, various solutions have been proposed to remove heat from such modules. For example, bulk cooling in which conduction is used to remove heat from the module as a whole by way of the backplane of the module, has been proposed. Such solutions are not very effective, however, because the backplane is typically constructed of a polymer material that is a poor conductor of heat. Moreover, the encapsulant material typically used to seal the modules also limits the conduction of heat from the module.

Attempts have also been made to remove heat directly from the active layer. For example, holes have been provided through the backplanes of modules in hopes of removing heat from the active layers through convection. In other cases, thermally-conductive pins have been provided through the backplanes in hopes of removing heat from the active layers through conduction. Although such solutions may be effective in the short term, they are undesirable because they compromise the integrity of seals of the module, which can result in degradation from the ingress of moisture and oxygen. In addition, such solutions compromise the structural integrity of the module, which can lead to early failure. Furthermore, such solutions increase the cost and complexity of manufacturing the modules.

In view of the above discussion, it can be appreciated that it would be desirable to have an alternative means for removing heat from a photovoltaic module.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

As described above, it would be desirable to have alternative means for removing heat from a photovoltaic module. Disclosed herein are photovoltaic modules incorporating lateral heat removal. In some embodiments, a photovoltaic module includes a planar heat sink provided within the stack of layers of the module that includes fluid channels through which heat can be laterally removed from the module via convection.

In the following disclosure, various specific embodiments are described. It is to be understood that those embodiments are example implementations of the disclosed inventions and that alternative embodiments are possible. All such embodiments are intended to fall within the scope of this disclosure.

Figure 1:
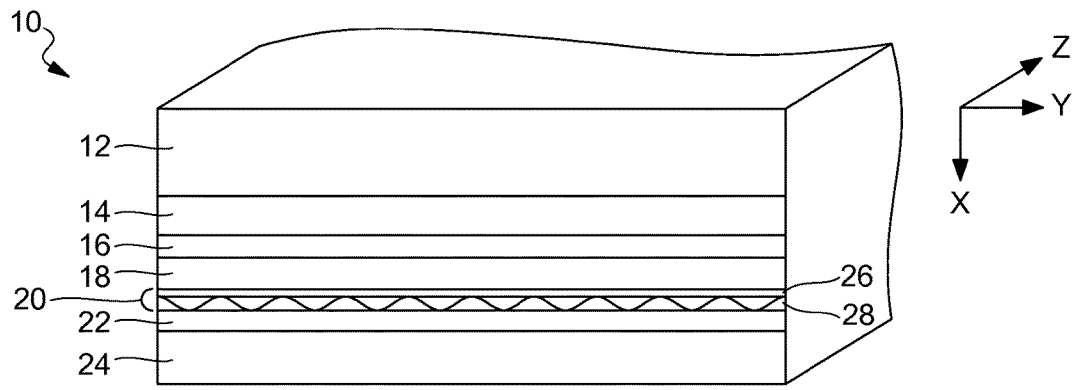
FIG. 1 is a perspective view of a first embodiment of a photovoltaic module that incorporates lateral heat removal.

FIG. 1 illustrates a first embodiment of a photovoltaic module 10 that incorporates lateral heat removal. As shown in the figure, the module 10 includes a stack of multiple layers including a top layer 12, a first sealing layer 14, an anti-reflective layer 16, an active layer 18, a planar heat sink 20, a second sealing layer 22, and a backplane 24. It is noted that the photovoltaic module 10 need not include each of these layers. Indeed, several of the layers shown in FIG. 1 can be omitted. Irrespective of this fact, example configurations are described below for each of the layers of FIG. 1.

In some embodiments, the top layer 12 is made of glass, the first and second sealing layers 14 and 22 are made of a polymer such as ethylene vinyl acetate (EVA), the anti-reflective layer 16 comprises an anti-reflective coating (ARC), and the backplane 24 is made of a polymer such as polyvinyl fluoride (PVF) (e.g., Tedlar®). The top layer 12 provides physical protection to the module 10, the sealing layers 14 and 22 fill voids that may exist between layers of the stack, the anti-reflective layer 16 prevents light from escaping the active layer 18, and the backplane 24 provides structural support to the module.

The active layer 18 is the layer of module 10 that converts light energy into useable electrical energy through the photovoltaic effect. In some embodiments, the active layer 18 is made of a semiconductor material, such as crystalline silicon (c-Si). In such a case, the active layer 18 comprises an n-type semiconductor layer and a p-type semiconductor layer that together form a layer interface. Light incident on the active layer 18 adjacent the interface creates hole-electron pairs in addition to those otherwise present, and the minority charge carriers migrate across the interface in opposite directions. Because there is no compensating flow of majority carriers, a net electrical charge results. A useful electrical current can then be obtained in an external electrical circuit (not shown) by forming ohmic contacts to the active layer 18 on either side of the interface.

The planar heat sink 20 is used to remove heat generated by the active layer 18 during operation of the photovoltaic module 10. As is indicated in FIG. 1, the planar heat sink 20 can comprise multiple layers. In some embodiments, the heat sink 20 comprises an electrical insulation layer 26 and a thermal conductor layer 28. The thermal conductor layer 28 comprises multiple fluid channels through which a fluid, such as air, can flow to remove heat from the active layer 18 via convection. The thermal conductor layer 28 is separated from the active layer 18 by the electrical insulation layer 26, which is thick enough to electrically isolate the thermal conductor layer from the active layer but thin enough to enable ample thermal conduction to the thermal conductor layer. The thermal conductor layer 28 is made of a thermally conductive material, such as graphene, graphite, metal (e.g., aluminum), or a metal alloy.

The channels can extend across an entire dimension (e.g., length or width) of the module 10 such that ambient air can flow through the channels, absorb heat from the channel walls, and carry this heat by convection out the end of the channels, which may be elevated because of the module's mounting angle (photovoltaic modules are typically pitched at an angle approximately equal to the latitude of the site). In some embodiments, the channels are parallel and aligned across the shortest dimension of the module 10.

The electrical insulation layer 26 is made of dielectric material having a high dielectric strength per unit thickness, such as polyimide. In some embodiments, the insulation layer 26 seals the edges of the thermal conductor layer 28 so as to seal the module 10 but leave the ends of the channels of the thermal conductor layer 28 open to enable venting of warm air out of the top ends of the channels and drawing of cool air into bottom ends of the channels. In some embodiments, the planar heat sink 20 can further include a layer of heat-conducting paste that is provided between the electrical insulation layer 26 and the active layer 18 to fill any voids that would otherwise exist between the two layers.

Example dimensions for the various module layers are provided in Table I.

TABLE I

Example layer thicknesses.

| Layer | Thickness (mm) |
| --- | --- |
| top layer 12 | 3.0 |
| sealing layer 14 | 0.5 |
| anti-reflective layer 16 | $(0.06\text{-}0.1)\ 10^{-3}$ |
| active layer 18 | 0.25-0.4 |
| electrical insulation layer 26 | 0.02-0.03 |
| thermal conductor layer 28 | 0.5-1.0 |
| sealing layer 22 | 0.5 |
| backplane 24 | 0.3 |

Figure 2:
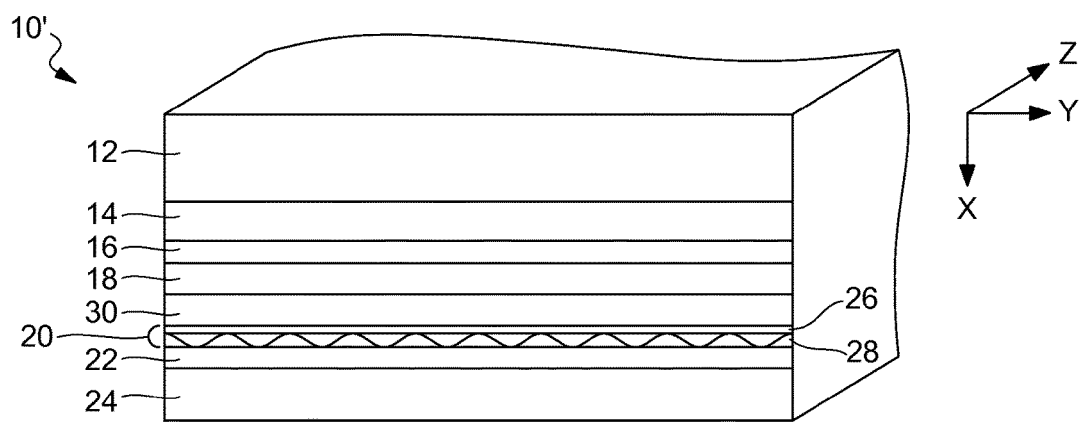
FIG. 2 is a perspective view of a second embodiment of a photovoltaic module that incorporates lateral heat removal.

FIG. 2 illustrates a second embodiment of a photovoltaic module 10' that incorporates lateral heat removal. The module 10' is similar in many ways to the module 10 shown in FIG. 1. Accordingly, the module 10' includes a stack of multiple layers including a top layer 12, a first sealing layer 14, an anti-reflective layer 16, an active layer 18, a planar heat sink 20, a second sealing layer 22, and a backplane 24. Each of these layers can have a configuration similar to that described above. In addition, however, the module 10' further comprises a thermoelectric element 30 that is positioned between the active layer 18 and the planar heat sink 20. Like the planar heat sink 20, the thermoelectric element 30 is configured to remove heat generated by the active layer 18. In some embodiments, the thermoelectric element 30 comprises an array of semiconductor pellets that have been doped so that one type of charge carrier, either positive or negative, carries the majority of current. The pairs of p/n pellets are configured so that they are electrically connected in series but thermally connected in parallel. When a small direct current (DC) voltage is applied to the thermoelectric element 30, the positive and negative charge carriers in the pellet array absorb heat energy from the active layer 18 and release it to the planar heat sink 20. U.S. Pat. No. 8,420,926, which is hereby incorporated by reference herein in its entirety, describes specific examples of suitable thermoelectric elements.

The thermal conductor layer 28 of the planar heat sink 20 can take various forms. FIGS. 3-8 illustrate example configurations. It is noted that the illustrated configurations are simply examples of the myriad configurations that are possible. Accordingly, there is no intention to limit the disclosure to any one of these particular configurations.

Figure 3:
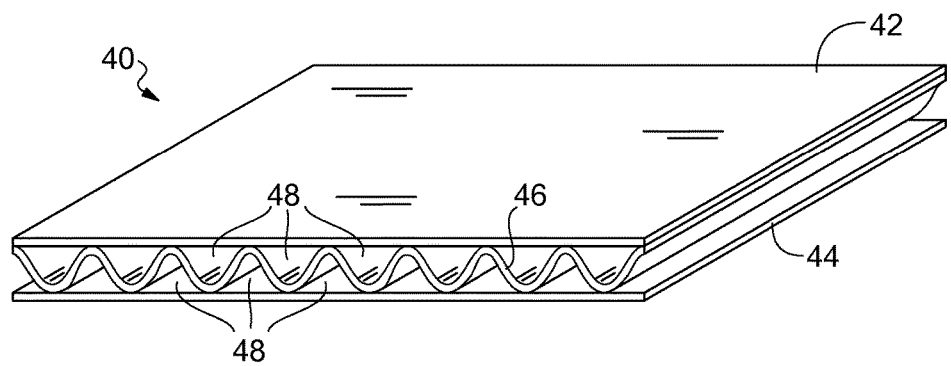
FIG. 3 is a perspective view of a first embodiment for a thermal conductor layer of the module of FIG. 1 or 2.

Beginning with FIG. 3, a thermal conductor layer 40 comprises a first or top planar layer 42 and a second or bottom planar layer 44 that are separated by an undulating medial layer 46. Each of the layers 42-46 of the thermal conductor layer 40 is made of a thermally conductive material. For example, each layer 42-46 can be made of graphene paper. The medial layer 46 varies with a sinusoidal pattern that is similar to that followed by the medial layers of corrugated cardboard. Therefore, the medial layer 46 periodically rises and falls so as to alternately contact and attach to the top planar layer 42 and the bottom planar layer 44. Through such alternating attachment, multiple linear fluid channels 48 are formed that extend along a dimension (e.g., width or length) of the thermal conductor layer 40 and, therefore, the photovoltaic module in which it is used. As is apparent from FIG. 3, the channels 48 have generally triangular cross-sections The fluid channels 48 preferably have small openings such that liquid (e.g., liquid water) cannot enter because of its surface tension. Alternatively, the upper ends of the openings to the channels 48 can be covered in a manner such that liquid cannot enter the channels. For example, manifolds can be used to consolidate the inlet and outlet openings of the channels 48 or a cap or hood can be provided on the ends of the channels to prevent water from entering the channels. In some embodiments, the cross-sectional areas of the channels 48 can be tapered from one end to the other so as to enhance the drawing of convection air.

In some embodiments, the thermal conductor layer 40 need not comprise the top and bottom planar layers 42, 44. In such a case, the medial layer 46 can be formed simultaneously with another layer of the module, such as one of the sealing layers. For example, the medial layer 46 can be formed on the EVA film of the sealing layer located beneath the active layer before the sealing layer is heated and/or at some time in the module fabrication process before the layers are set onto the backplane and laminated. In some embodiments, the medial layer 46 can be printed onto the sealing layer.

Figure 4:
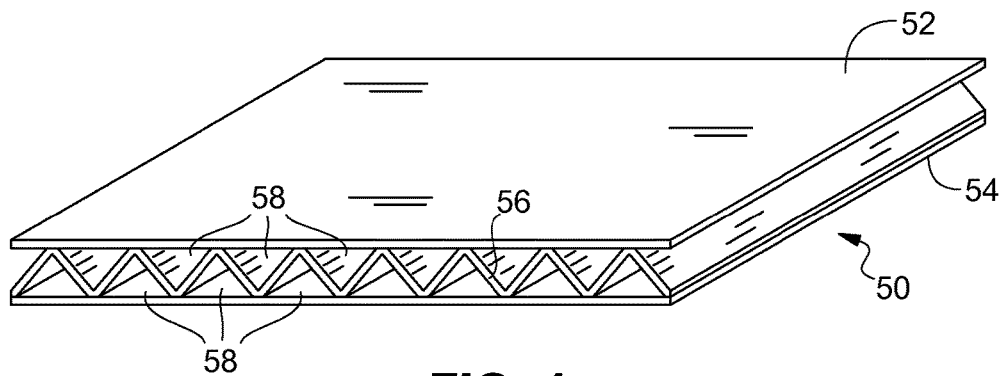
FIG. 4 is a perspective view of a second embodiment for a thermal conductor layer of the module of FIG. 1 or 2.

FIG. 4 illustrates a thermal conductor layer 50 that is similar to the layer 40 of FIG. 3. The thermal conductor layer 50 therefore comprises top and bottom planar layers 52 and 54 and an undulating medial layer 56 that forms linear fluid channels 58. In the embodiment of FIG. 4, however, the medial layer 56 is more angular and, as a result, the fluid channels 58 have more definitive triangle-shaped cross-sections.

Figure 5:
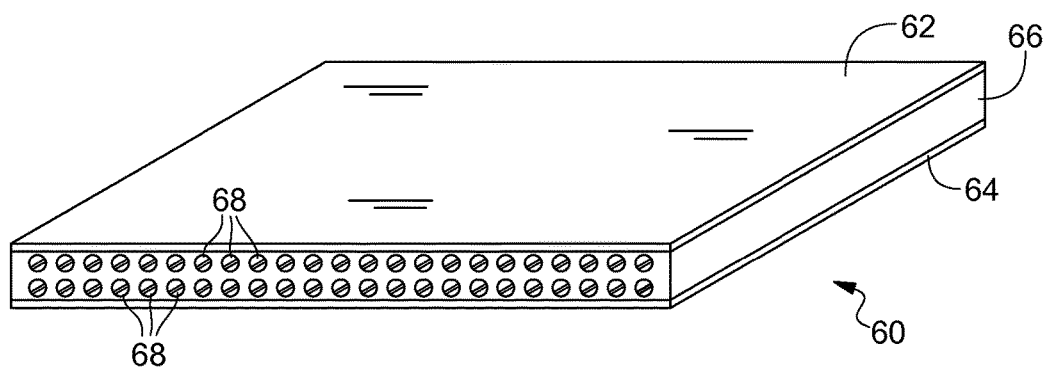
FIG. 5 is a perspective view of a third embodiment for a thermal conductor layer of the module of FIG. 1 or 2.

Turning to FIG. 5, a thermal conductor layer 60 comprises top and bottom planar layers 62 and 64 and a medial layer 66 that comprises multiple cylindrical fluid channels 68. As shown in FIG. 5, the channels 68 are provided in two parallel rows that extend across a dimension (e.g., width or length) of the medial layer 66. As with the triangular channels of the thermal conductor layers 50 and 60, the openings of the channels 68 can have dimensions that prevent the ingress of liquid.

Figure 6:
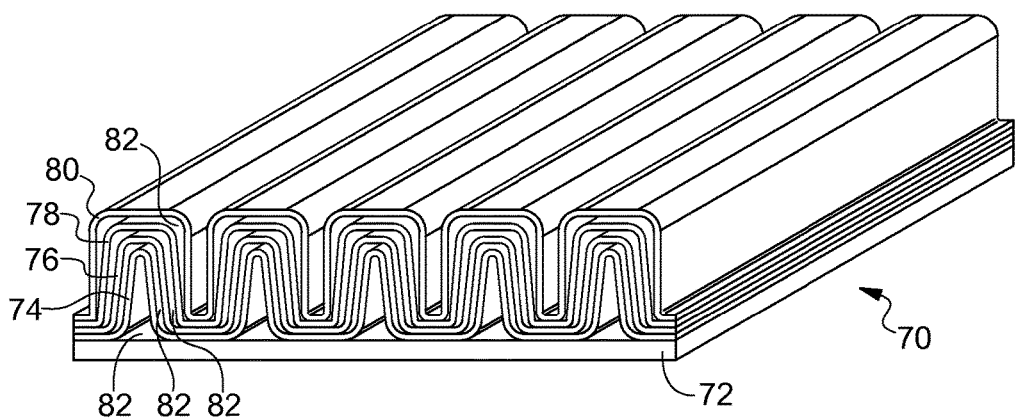
FIG. 6 is a perspective view of a fourth embodiment for a thermal conductor layer of the module of FIG. 1 or 2.

With reference next to FIG. 6, a thermal conductor layer 70 comprises a substrate 72 upon which are provided multiple layers 74-80 of material. Each of the layers 74-80 undulate across a dimension (e.g., width or length) of the thermal conductor layer 70. Because each layer 74-80 extends upward from the substrate 72 to a different height (i.e., each sequential layer is taller than the previous layer) multiple fluid channels 82 are formed through which cooling fluid (e.g., air) can flow. In some embodiments, each layer 74-80 comprises a graphene sheet.

Figure 7:
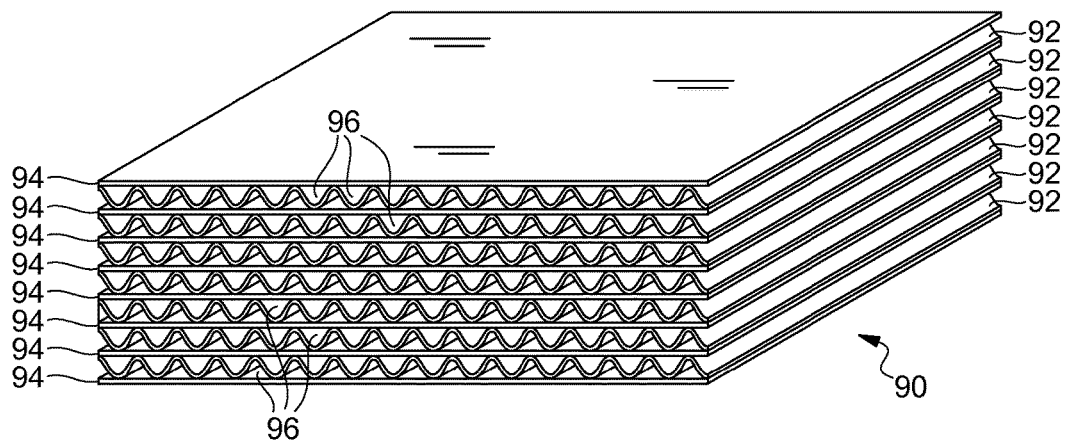
FIG. 7 is a perspective view of a fifth embodiment for a thermal conductor layer of the module of FIG. 1 or 2.

FIG. 7 illustrates a thermal conductor layer 90 that comprises multiple undulating medial layers 92 similar to the medial layer 46 of the thermal conductor layer 40. Each of these layers 92 can be separated by a planar layer 94, which is similar to the top and bottom planar layers 42, 44 of the thermal conductor layer 40. Together, the planar layers 94 and the medial layers 92 form linear fluid channels 96 through which cooling fluid can flow. Accordingly, the thermal conductor layer 90 can be thought of as multiple thermal conductor layers 40 that are stacked on top of one another. As is apparent in FIG. 7, the medial layers 92 each have the same orientation in the stack such that the fluid channels 96 are all parallel to each other.

Figure 8:
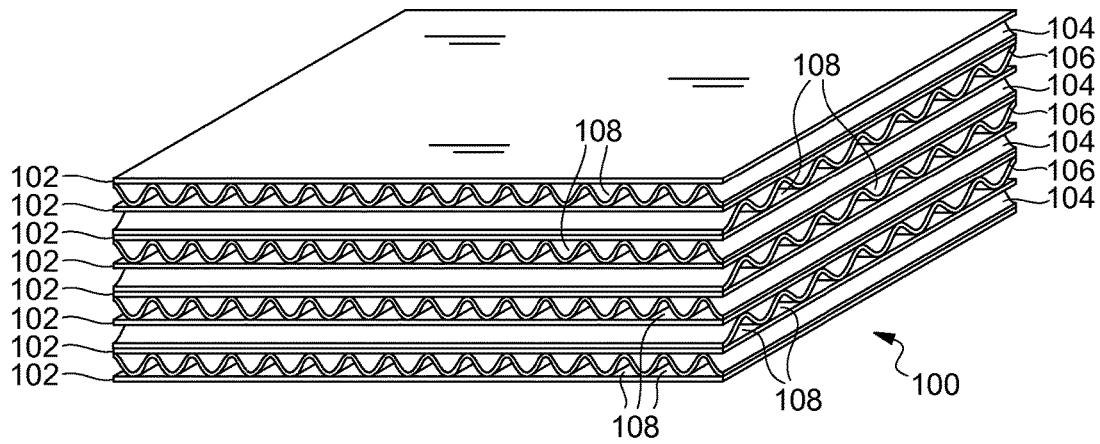
FIG. 8 is a perspective view of a sixth embodiment for a thermal conductor layer of the module of FIG. 1 or 2.

FIG. 8 shows a thermal conductor layer 100 that is similar to the thermal conductor layer 90 of FIG. 7. Therefore, the thermal conductor layer 100 also comprises multiple undulating medial layers separated by planar layers 102 that together form fluid channels 108 through which cooling fluid can flow. In the embodiment of FIG. 8, however, the medial layers have alternate orientations in the stack. Specifically, medial layers 104 having a first orientation are alternately separated by medial layers 106 having a second orientation that is 90° out of phase of the first orientation. With such a configuration, the fluid channels 96 of any given layer are perpendicular to the fluid channels of any adjacent layer in the stack (i.e., the orientation of the layers alternate throughout the stack). Because fluid channels 96 extend in both the width and length dimensions of the thermal conductor layer 100, the layer is effective irrespective of the orientation in which it is used.

Any one of the above-described embodiments can be modified to alter the nature or performance of the photovoltaic module. In some embodiments, forced convection, facilitated by the use of a fan or pump, can be used to increase the cooling capabilities of the thermal conductor layer. In other embodiments, a working fluid other than air can be used to improve the convection cooling. In further embodiments, a closed-loop system, such as a planar thermosiphon, can be used in which the working fluid is contained and circulated within a closed system. The working fluid in such a case can comprise a phase change material (e.g., a salt material) that changes phase within the system, such as in the case of a planar heat pipe. Furthermore, although the backplane of the photovoltaic modules have been described as comprising a polymer, other materials, such as metal materials, can be used to increase heat dissipation.

The invention claimed is:

1. A photovoltaic module comprising:
a stack of layers including:
an photoactive layer spanning an entire width of the photovoltaic module; and
a planar heat sink including an electrically insulating and thermally conducting layer having one side in direct physical contact with the photoactive layer and an opposite side of the electrically insulating and thermally conducting layer in direct physical contact with a thermal conductor layer that comprises a thermally conductive material on a side of the heat sink opposite the photoactive layer, a backplane that comprises a polymer and a sealing layer between the backplane and the planar heat sink;
wherein the thermal conductor layer includes fluid channels that span the entire width of the photovoltaic module through which a fluid can flow to remove heat via convection from the photoactive layer.

2. The photovoltaic module of claim 1, wherein the active layer is made of crystalline semiconductor.

3. The photovoltaic module of claim 2, wherein the photoactive layer comprises an n-type semiconductor layer and a p-type semiconductor layer that together form an interface.

4. The photovoltaic module of claim 1, wherein the thermal conductor layer comprises an undulating layer that forms the fluid channels.

5. The photovoltaic module of claim 4, wherein the undulating layer varies with a sinusoidal pattern.

6. The photovoltaic module of claim 5, wherein the thermal conductor layer further comprises a planar layer provided on each side of the undulating layer and wherein the undulating layer periodically rises and falls so as to alternately contact the planar layers.

7. The photovoltaic module of claim 4, wherein the undulating layer is made of graphene, graphite, metal, or a metal alloy.

8. The photovoltaic module of claim 4, wherein the undulating layer is made of graphene paper.

9. The photovoltaic module of claim 1, wherein the thermal conductor layer comprises multiple undulating layers that form the fluid channels.

10. The photovoltaic module of claim 9, wherein the fluid channels of each undulating layer extend along the same direction of the module.

11. The photovoltaic module of claim 9, wherein the fluid channels of alternate undulating layers extend along opposite directions of the module.

12. A method for removing heat from a photovoltaic module, the method comprising:
said photovoltaic module comprising a stack of layers, including:
an photoactive layer spanning an entire width of the photovoltaic module;
a planar heat sink, the planar heat sink comprising an electrically insulating and thermally conducting layer having one side in direct physical contact with an photoactive layer and an opposite side of the electrically insulating and thermally conducting layer in direct physical contact with a thermal conductor layer that comprises a thermally conductive material wherein the thermal conductor layer includes fluid channels that span the entire width of the photovoltaic module through which a fluid can flow to remove heat via convection; and on a side of the heat sink opposite the photoactive layer,
a backplane that comprises a polymer and a sealing layer between the backplane and the planar heat sink;
laterally removing heat from the photoactive layer using the planar heat sink.

13. The method of claim 12, wherein laterally removing heat comprises removing heat via convection using fluid channels formed in the thermally conductive material.

14. The method of claim 13, wherein the fluid channels are formed by an undulating layer of the planar heat sink.

* * * * *

UNITED STATES PATENT AND TRADEMARK OFFICE
CERTIFICATE OF CORRECTION

| | | |
|---|---|---|
| PATENT NO. | : 10,361,327 B2 | |
| APPLICATION NO. | : 14/206433 | |
| DATED | : July 23, 2019 | |
| INVENTOR(S) | : Nicoleta Sorloaica and Robert Reedy | |

It is certified that error appears in the above-identified patent and that said Letters Patent is hereby corrected as shown below:

On the Title Page

The Applicant named in item (71) should be replaced with the following:
--(71) Assignee: UNIVERSITY OF CENTRAL FLORIDA RESEARCH FOUNDATION, INC.--

Signed and Sealed this
Thirteenth Day of August, 2024

Katherine Kelly Vidal
*Director of the United States Patent and Trademark Office*